United States Patent
Ku

(10) Patent No.: US 7,994,834 B2
(45) Date of Patent: Aug. 9, 2011

(54) DUTY CYCLE CORRECTOR AND CLOCK GENERATOR HAVING THE SAME

(75) Inventor: Young-Jun Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 143 days.

(21) Appl. No.: 12/346,005

(22) Filed: Dec. 30, 2008

(65) Prior Publication Data

US 2010/0073057 A1 Mar. 25, 2010

(30) Foreign Application Priority Data

Sep. 22, 2008 (KR) ........................ 10-2008-0092805

(51) Int. Cl.
 H03K 3/017 (2006.01)
 H03K 5/04 (2006.01)
 H03K 7/08 (2006.01)
(52) U.S. Cl. ...................................................... 327/175

(58) Field of Classification Search .................. 327/175, 327/146, 158
See application file for complete search history.

(56) References Cited

U.S. PATENT DOCUMENTS

| 2005/0286672 A1* | 12/2005 | Lin et al. ........................ 375/376 |
| 2007/0069782 A1* | 3/2007 | Shin .............................. 327/158 |
| 2008/0001640 A1* | 1/2008 | Choi ............................. 327/158 |

* cited by examiner

*Primary Examiner* — Lincoln Donovan
*Assistant Examiner* — Daniel Rojas
(74) *Attorney, Agent, or Firm* — IP & T Group LLP

(57) ABSTRACT

A duty cycle corrector includes a delay unit configured to adjust an input clock and an inverted input clock with a delay value controlled in response to one or more control signals and to generate a positive clock and a negative clock, and a duty detector configured to receive the positive clock and the negative clock, to detect duty ratios of the positive clock and the negative clock and to generate the one or more control signals.

15 Claims, 8 Drawing Sheets

DUTY CYCLE CORRECTOR AND CLOCK GENERATOR HAVING THE SAME

CROSS-REFERENCE TO RELATED APPLICATIONS

The present invention claims priority of Korean patent application number 10-2008-0092805, filed on Sep. 22, 2008, which is incorporated by reference in its entirety.

BACKGROUND OF THE INVENTION

The present invention relates to a Duty Cycle Corrector (DCC), and more particularly, to a technique for correcting duty cycle with one clock to improve characteristics of DCC.

In semiconductor devices that operate based on a clock, a technique of controlling a duty cycle of the clock exactly is important. A clock duty of 50% indicates that a 'high' level interval of a clock signal is identical to a 'low' level interval of a clock signal.

For a semiconductor memory device, data should be input/output exactly in synchronization with a rising edge and a falling edge of a clock. In such a semiconductor device, if a duty ratio of clock is not exactly 50%, a timing mismatch occurs between the rising edge and the falling edge, which makes data not input/output at exact timing. Therefore, a semiconductor memory device adopts a DCC to correct a duty cycle of clock exactly to 50%.

FIG. 1 is a block diagram illustrating a conventional DCC for correcting a duty cycle of clock by mixing clocks.

In a conventional DCC 130 that corrects a duty cycle by mixing clocks CLK_1 and CLK_2, since the duty cycle is corrected by mixing the two clocks CLK_1 and CLK_2 having synchronized rising edges, a Delay Locked Loop (DLL) of dual loop structure is arranged in front of the DCC 130.

The DLL compensates for skew between an external clock EXTCLK and the internal clocks CLK_1 and CLK_2, and includes a first delay locking unit 110 and a second delay locking unit 120. The first delay locking unit 110 adjusts a delay value of the first clock CLK_1 to synchronize its rising edge with a rising edge of the external clock EXTCLK when there is a delay in the first clock CLK_1 while it passes through a chip. The second delay locking unit 120 adjusts a delay value of the second clock CLK_2 as an inverted clock of the first clock to synchronize its rising edge with a rising edge of the external clock EXTCLK when there is a delay in the second clock CLK_2 while it passes through the chip.

The present invention to be described later relates to the DCC 130 but does not relate directly to the DLL 110 and 120 and, since designing the DLL of dual loop structure is well-known to those skilled in the art, a further description thereon will be omitted herein.

The conventional DCC 130 mixes the first clock CLK_1 with the second clock CLK_2 as output clocks of the DLLs 110 and 120, and generates clocks CLK1_OUT and CLK2_OUT having corrected duty cycle. The first clock CLK_1 and the second clock CLK_2 have opposite duties (e.g., the first clock has a duty ratio of 7:3 and the second clock has a duty ratio of 3:7) and are synchronized with each other at their rising edge. Therefore, mixing the two clocks CLK_1 and CLK_2 may generate the clocks CLK1_OUT and CLK2_OUT having exactly 5:5 duty.

FIG. 2 a timing diagram showing a schematic operation of the conventional DCC 130.

The first clock CLK_1 and the second clock CLK_2 having locked delay values are output from the first delay locking unit 110 and the second delay locking unit 120 of the DLL.

Referring to the drawing, it can be seen that the first clock CLK_1 and the second clock CLK_2 have independently locked delay values but have identically aligned rising edges.

The DCC 130 mixes the first clock CLK_1 with the second clock CLK_2. Since rising edges of the first clock CLK_1 and the second clock CLK_2 are aligned with each other, rising edges of mixed clocks CLK1_OUT and CLK2_OUT (upon completion of operation, CLK1_OUT=CLK2_OUT) remain unchanged. However, falling edges thereof have middle values of the falling edge of the first clock CLK_1 and the second clock CLK_2. Thus, the clocks CLK1_OUT and CLK2_OUT whose duties are corrected to 50% are output from the DCC 130.

The conventional DCC described above generates clocks having 50% duty by mixing the two clocks having opposite duties. However, although the two clocks having opposite duties are mixed, rising edges of the two clocks should be aligned with each other. Thus, there is a need for the DLL of dual loop structure in front of the DCC.

In short, since the conventional DCC adopts a technique of combining two clocks to correct a duty cycle of clock, it needs the DLL of dual loop structure in front of the DCC, which increases the overall area of the DLL two times.

SUMMARY OF THE INVENTION

Exemplary embodiments of the present invention are directed to providing a Duty Cycle Corrector (DCC) without the use of two clocks with opposite duties and aligned rising edges, and also to improving jitter characteristics of the DCC.

In accordance with an aspect of the invention, a duty cycle corrector includes a delay unit configured to adjust an input clock and an inverted input clock with a delay value controlled in response to one or more control signals and to generate a positive clock and a negative clock, and a duty detector configured to receive the positive clock and the negative clock, detect duty ratios of the positive clock and the negative clock and to generate the one or more control signals.

In accordance with another aspect of the invention, a duty cycle corrector includes a positive delay unit configured to adjust a delay value of an input clock in response to a positive increase control signal and a positive decrease control signal to output a positive clock, and a negative delay unit configured to adjust the inverted input clock with a delay value controlled in response to a negative increase control signal and a negative decrease control signal and to output a negative clock, a clock generator configured to generate a first clock that is activated from a predetermined edge of the positive clock to a predetermined edge of the negative clock, and to generate a second clock that is activated from a predetermined edge of the negative clock to a predetermined edge of the positive clock, and a detector configured to compare an activation interval of the first clock with that of the second clock and to produce the positive increase control signal, the positive decrease control signal, the negative increase control signal and the negative decrease control signal.

In accordance with another aspect of the invention, a clock generator includes a delay locked loop as a single loop configured to generate an internal clock in response to an external clock, and a duty cycle corrector configured to correct a duty cycle of the internal clock, where the duty cycle corrector includes a delay unit configured to adjust the internal clock and an inverted internal clock with a delay value controlled in response to one or more control signals to generate a positive clock and a negative clock, and a duty detector configured to receive the positive clock and the negative clock, detect duty ratios of the positive clock and the negative clock and to output the one or more control signals.

DESCRIPTION OF SPECIFIC EMBODIMENTS

Hereinafter, the embodiments of the present invention will be described in detail with reference to the accompanying drawings so that the invention can easily be practiced by those skilled in the art to which the invention pertains.

Figure 3:
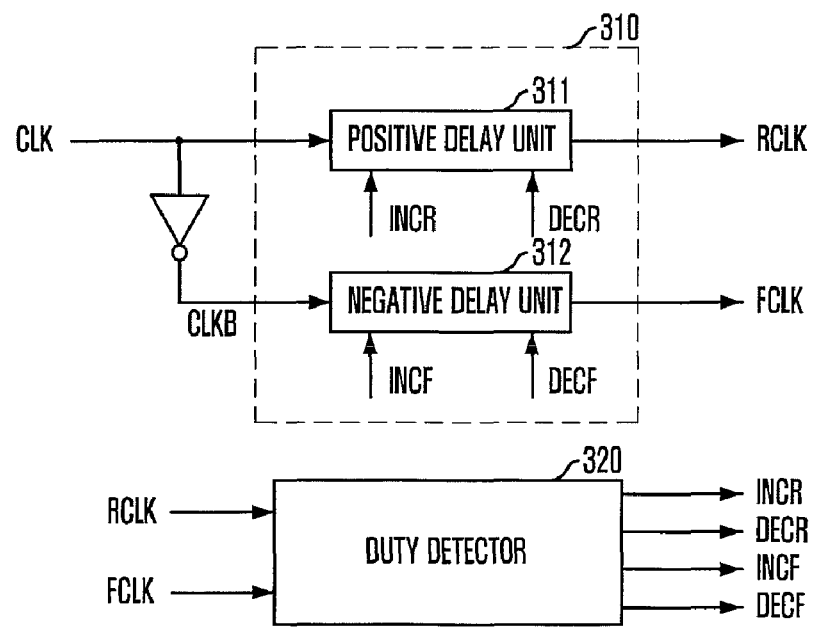
FIG. 3 is a block diagram illustrating the configuration of a DCC in accordance with an embodiment of the present invention.

FIG. 3 is a block diagram illustrating the configuration of a Duty Cycle Corrector (DCC) in accordance with an embodiment of the present invention. As shown, the DCC in accordance with an embodiment of the present invention includes a delay unit 310, a duty detector 320. The delay unit adjusts relative delay values between an input clock CLK and an inverted clock CLKB of the input clock in response to one or more control signals INCR, DECR, INCF and DECF and generates a positive clock RCLK and a negative clock FCLK. The duty detector 320 receives the positive clock RCLK and the negative clock FCLK, detects their duties and generates the one or more control signals INCR, DECR, INCF and DECF.

To be specific, a rising edge of the negative clock FCLK represents a falling edge of the positive clock RCLK. Therefore, if relative delay values between the input clock CLK and the inverted clock CLKB are adjusted to locate a rising edge of the negative clock FCLK exactly at the center of rising edges of the positive clock RCLK, it is regarded that the positive clock FCLK and the negative clock RCLK are clocks whose duties are adjusted to 50%. This is because, although the positive clock RCLK and the negative clock FCLK actually have a 'high' pulse and a 'low' pulse with different widths, a rising edge of the negative FCLK may indicate a falling edge of the positive clock RCLK whose duty is 50%.

In general, as a delay value of the input clock CLK is set to be larger than that of its inverted clock CLKB, 'high' pulse widths of the output clocks RCLK and FCLK are decreased and, as a delay value of the inverted clock CLKB is set to be larger than that of the input clock CLK, 'low' pulse widths of the output clocks RCLK and FCLK are decreased.

The delay unit 310 includes a positive delay unit 311 and a negative delay unit. The positive delay unit 311 adjusts a delay value of the input clock CLK to output the positive clock RCLK. The negative delay unit 312 adjusts a delay value of the inverted clock CLKB to generate the negative clock FCLK. The positive delay unit 311 increases its own delay value whenever a positive increase control signal INCR is enabled and decrease its own delay value whenever a positive decrease control signal DECR is enabled. The negative delay unit 312 increase its own delay value whenever a negative increase control signal INCF is enabled and decrease its own delay value whenever a negative decrease control signal DECF is enabled.

The duty detector 320 receives the positive clock RCLK and the negative clock FCLK and detects their duties. To be specific, the duty detector 320 generates the control signals INCR, DECR, INCF and DECF so as to increase a delay value of the positive delay unit 311 or decrease a delay value of the negative delay unit 312 if a 'high' pulse width from a rising edge of the positive clock to a rising edge of the negative clock is large, and to increase a delay value of the negative delay unit 312 or decrease a delay value of the positive delay unit 311 if a 'low' pulse width is large.

The duty correction is performed by adjusting relative delay values between the positive delay unit 311 and the negative delay unit 312. The increase of a delay value in the positive delay unit 311 has an identical effect to the decrease of a delay value in the negative delay unit 312, and the increase of a delay value in the negative delay unit 312 has an identical to the decrease of a delay value in the positive delay unit 311. Thus, it is possible to correct the duty cycle of clock in response to the positive increase signal INCR and the negative increase signal INCF, or in response to the positive decrease signal DECR and the negative decrease signal DECF. Alternatively, it may be also possible to correct the duty cycle of clock by using the positive delay unit 311 without the negative delay unit 312 in response to the positive increase signal INCR and the positive decrease signal DECR, or by using the negative delay unit 312 without the positive delay unit 311 in response to the negative increase signal INCF and the negative decrease signal DECF.

Figure 4:
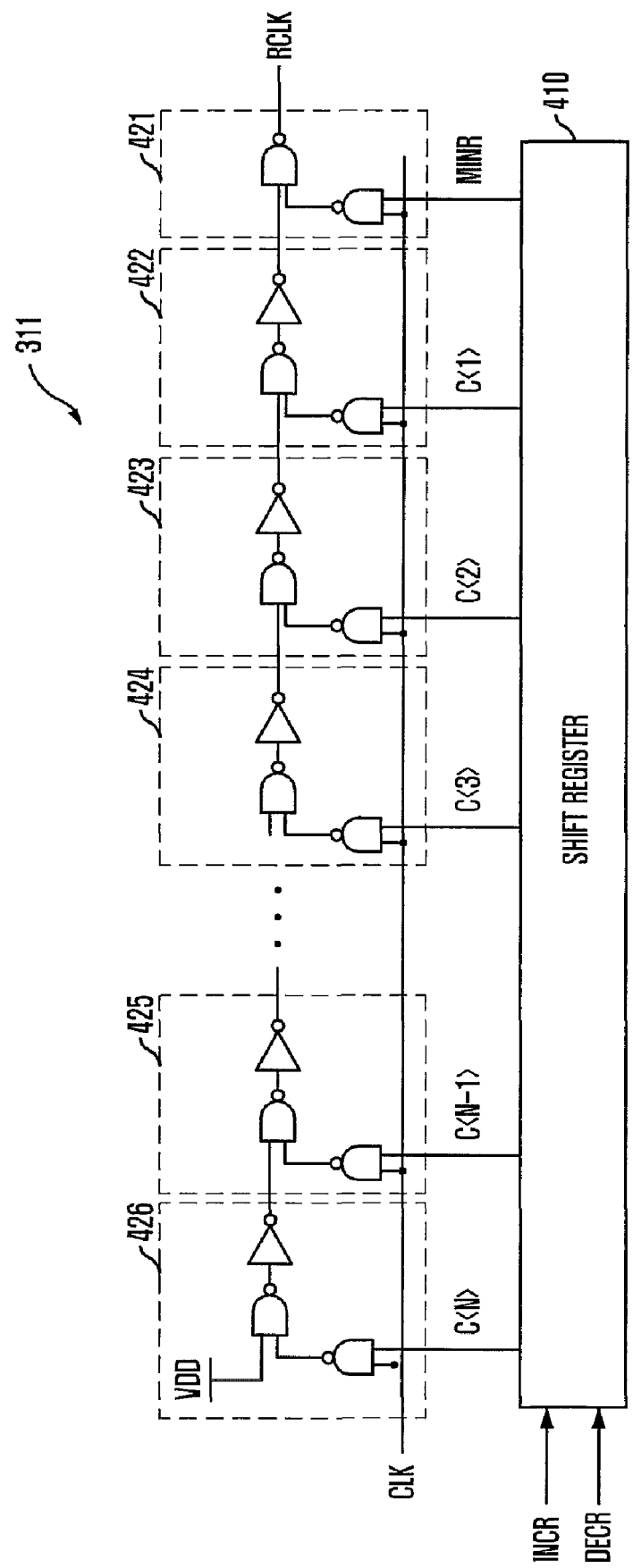
FIG. 4 is a detailed block diagram of the positive delay unit shown in FIG. 3.

FIG. 4 is a detailed block diagram of the positive delay unit shown in FIG. 3.

As shown, the positive delay unit 311 includes a shift register 410 and a plurality of delay units 421, 422, 423, 424, 425, and 426. The shift register 410 shifts enabled signals out of its own output signals MINR and C<1> to C<N> left and right whenever the positive increase signal INCR and the positive decrease signal DECR are enabled and input thereto. When the positive increase signal INCR is enabled and input in a state where C<1> was enabled, C<2> is enabled. And then, when the positive increase signal INCR is enabled and input once again, C<3> is enabled.

Similarly, when the positive decrease signal DECR is enabled and input in a state where C<3> was enabled, C<2> is enabled. Then, when the positive decrease signal DECR is enabled and input once again, C<1> is enabled.

The positive minimum signal MINR corresponding to C<0> is referred to as MINR instead of C<0>, because it is used for the positive delay unit 111 as well as other blocks to be described later.

The delay value of the clock CLK is dependent on whether any of the output signals MIMR and C<1> to C<N> from the shift register 410 is enabled. When the positive minimum signal MINR is enabled, the clock CLK is output as the positive clock RCLK after passing through one delay unit 421. When C<1> is enabled, the clock CLK is output as the positive clock RCLK after passing through two delay units 421 and 422. Likewise, when C<2> is enabled, the clock CLK is output as the positive clock RCLK after passing through three delay units 421, 422 and 423.

That is, the clock CLK is more delayed and is output as the positive clock RCLK whenever the positive increase signal INCR is enabled and input to the positive delay unit 311. The clock CLK is less delayed and is output as the positive clock RCLK whenever the positive decrease signal DECR is enabled and input.

A signal that is initially enabled by the shift register 311 may be any of MINR and C<1> to C<N>, but MINR is set to be initially enabled normally.

The negative delay unit 312 has an identical configuration to the positive delay unit 311 shown in FIG. 4, except that the positive increase signal INCR and the positive decrease signal DECR are replaced with the negative increase signal INCF and the negative decrease signal DECF, respectively, and the input clock CLK and the positive clock RCLK are replaced with the inverted clock CLKB and the negative clock FCLK, respectively. Moreover, a signal of the negative delay unit 312 corresponding to the positive minimum signal MINR of the positive delay unit 311 will be referred to herein as a negative minimum signal MINF.

Figure 5:
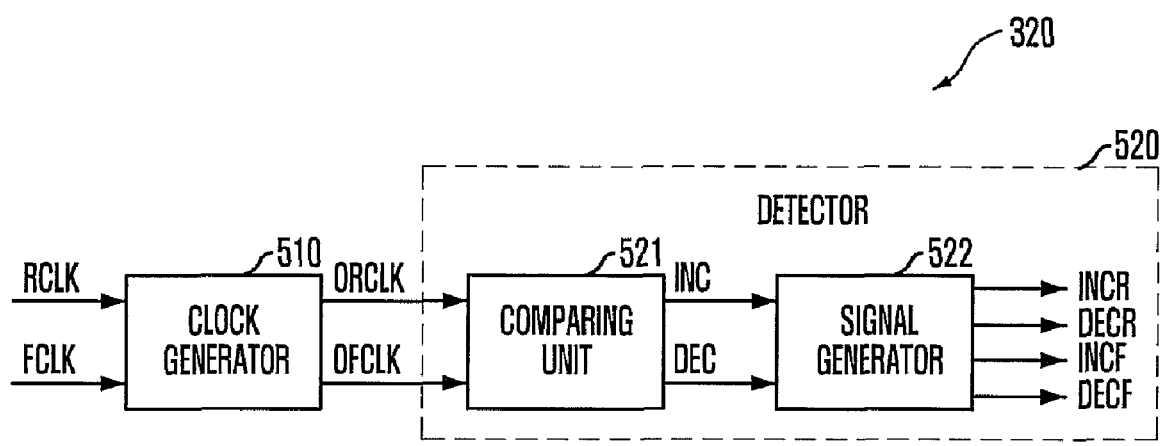
FIG. 5 is a detailed block diagram of the duty detector shown in FIG. 3.

FIG. 5 is a detailed block diagram of the duty detector shown in FIG. 3.

The duty detector 320 includes a clock generator 510 and a detector 520. The clock generator 510 generates a first clock ORCLK that is activated from a predetermined edge of the positive clock RCLK to a predetermined edge of the negative clock FCLK and a second clock OFCLK that is activated from a predetermined edge of the negative clock FCLK to a predetermined edge of the positive clock RCLK. The detector 520 compares an activation interval of the first clock ORCLK with that of the second clock OFCLK and generates a positive increase control signal INCR, a positive decrease control signal DECR, a negative increase control signal INCF and a negative decrease control signal DECF.

To be specific, the clock generator 510 generates a first clock ORCLK that is activated from a predetermined edge of the positive clock RCLK to a predetermined edge of the negative clock FCLK. If the predetermined edge is a rising edge, the first clock ORCLK has a logic 'high' value during the same interval as a 'high' pulse of a clock having a corrected duty, which is expressed by the positive clock RCLK and the negative clock FCLK. If the predetermined edge is a falling edge, the first clock ORCLK has a 'high' value during a 'low' pulse of the clock having a corrected duty. For the sake of convenience in explanation, it is assumed that the predetermined edge is a rising edge in all cases hereinafter.

In addition, the clock generator 510 generates a second clock OFCLK that is activated from a predetermined edge of the negative clock FCLK to a predetermined edge of the positive clock RCLK. Thus, the second clock OFCLK has a logic 'high' value during the same interval as a 'low' pulse of the clock having a corrected duty.

As mentioned above, the first clock ORCLK has a logic 'high' value during a 'high' pulse interval (from a rising edge of the positive clock to a rising edge of the negative clock) of the clock expressed by the positive clock RCLK and the negative clock FCLK, and the second clock has a logic 'high' value during a 'low' pulse interval (from a rising edge of the negative clock to a rising edge of the positive clock) of the clock expressed by the positive clock RCLK and the negative clock FCLK. The generation of the first clock ORCLK and the second clock OFCLK makes it sure that the detector 520 to be described later may effectively detect the degree of duty mismatch.

Also, the first clock ORCLK and the second clock OFCLK instead of the positive clock and the second clock may be used as final output clocks of the DCC. This is because, if the delay values of the positive clock RCLK and the negative clock FCLK have been adjusted to a duty ratio of 50%, the first clock ORCLK will be a clock whose 'high' pulse interval and 'low' pulse interval are identical exactly to each other and the second clock OFCLK will be its inverted clock.

The detector 520 compares an activation interval of the first clock ORCLK with that of the second clock OFCLK and generates a positive increase control signal INCR, a positive decrease control signal DECR, a negative increase control signal INCF and a negative decrease control signal DECF. The detector 520 includes a comparing unit 521 and a signal generator 522. The comparing unit 521 compares an activation interval of the first clock ORCLK with that of the second clock OFCLK The signal generator 522 activates the positive decrease control signal DECR or the negative increase control signal INCF if an activation interval of the first clock ORCLK is larger than that of the second clock OFCLK based on the comparison result, and activates the positive decrease control signal DECR or the negative increase control signal INCF if an activation interval of the second clock OFCLK is larger than that of the first clock ORCLK based on the comparison result.

If the positive decrease control signal DECR is activated, the delay value of the positive clock RCLK is decreased or the negative increase control signal INCF is activated, and the delay value of the negative clock FCLK is increased, relative delay values between the positive clock RCLK and the negative clock FCLK are identically changed. That is, there is the same effect that a 'high' pulse width of a clock expressed by the positive clock RCLK and the negative clock FCLK is decreased and a 'low' pulse width thereof is increased.

Also, if the negative decrease control signal DECF is activated, the delay value of the negative clock RCLK is decreased or the positive increase control signal INCR is activated, and the delay value of the positive clock RCLK is increased, relative delay values between the positive clock RCLK and the negative clock FCLK are identically changed. That is, there is the same effect that a 'high' pulse width of a clock expressed by the positive clock RCLK and the negative clock FCLK is increased and a 'low' pulse width thereof is decreased.

The relative delay values between the positive clock RCLK and the negative clock FCLK is changed to adjust a duty cycle. However, there is another point to be taken into consideration. The characteristics of clock become poor as the clock passes through more delays. In other words, there is a high possibility that a clock will contain jitter components such as a noise as the clock passes through more delay lines. Therefore, if it is designed that the clock could pass through less delay lines, the characteristics of clock may be improved.

For this, the clock generator 522 of the present invention activates the positive decrease control signal DECR prior to the negative increase control signal INCF. As described above, if the positive decrease control signal DECR is activated or the negative increase signal INCF is activated, the duty cycles of clocks are identically corrected. However, the positive decrease control signal DECR decreases the delay value, while the negative increase control signal INCF increases the delay value. Thus, if the positive decrease control signal DECR is activated prior to the negative increase control signal INCF, the delay value of clock may be reduced, which makes characteristics of clock excellent. Needless to say, if the current delay value of the positive delay unit 311 is initially set, the delay value of the positive delay unit 311 may be no longer reduced. In this case, the negative increase control signal INCF is activated instead of the positive decrease control signal DECR.

As described above, therefore, the signal generator 522 of the present invention activates the negative decrease control signal DECF prior to the positive increase control signal INCR. Even though the negative decrease control signal DECF and the positive increase control signal INCR have the same effect in view of duty correction of clock, the reason of decreasing the delay value improves characteristics of clock. Of course, if the current delay value of the negative delay unit 312 is set minimally, its delay value may be no longer decreased. In this case, the positive increase control signal INCR is activated instead of the negative decrease control signal DECF.

The signal generator 522 of the present invention sets the delay value used for duty correction to a minimum through the control operation described above, thereby making characteristics of clock excellently kept.

Figure 6A:
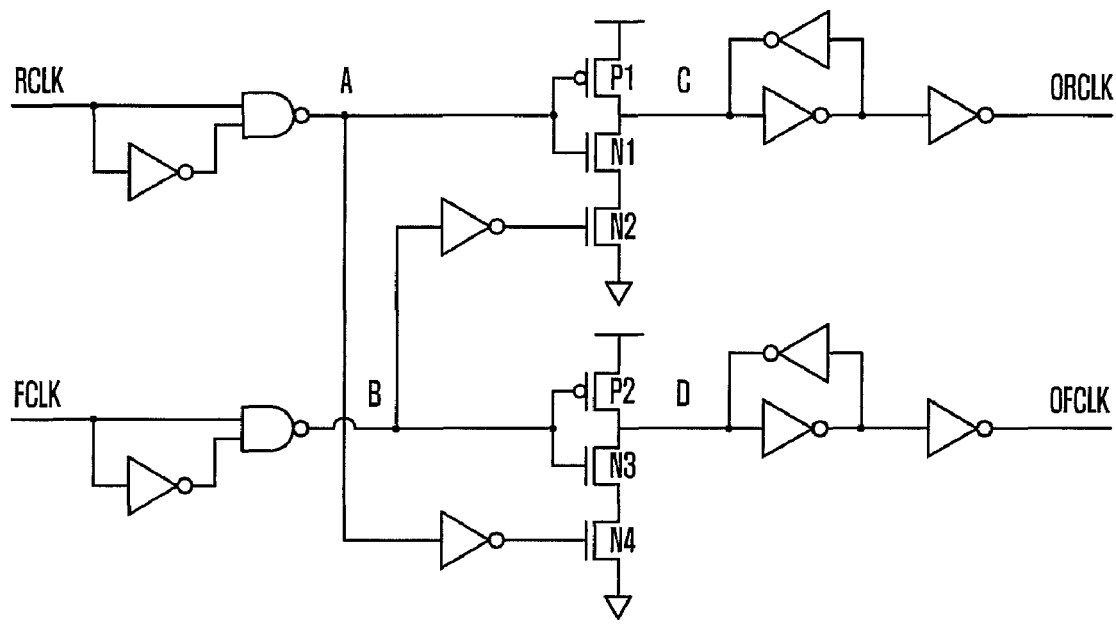
FIG. 6A is a detailed circuit diagram of the clock generator shown in FIG. 5.
Figure 6B:
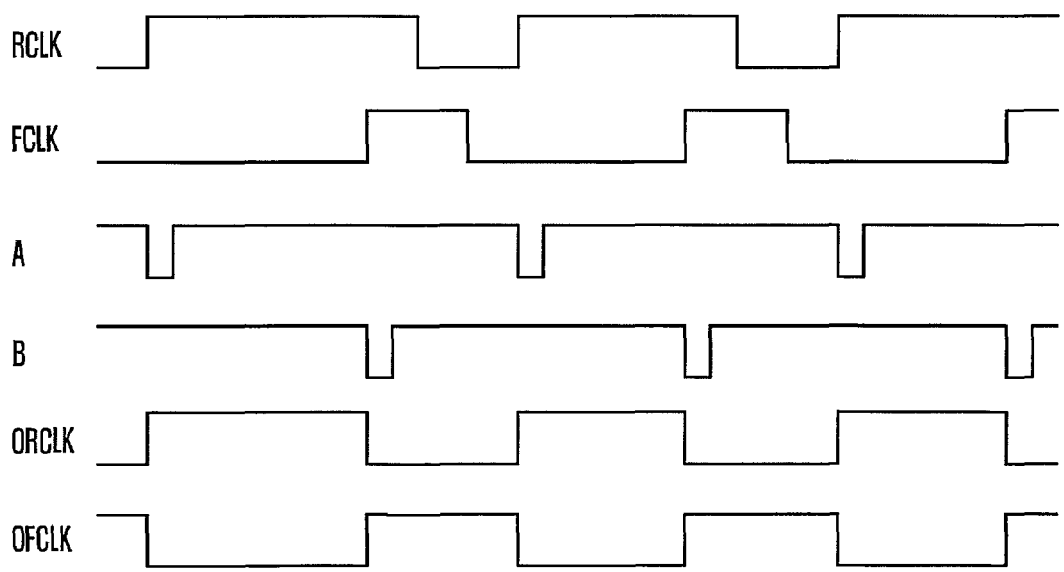
FIG. 6B is a timing diagram describing the operation of the clock generator.

FIG. 6A is a detailed circuit diagram of the clock generator shown in FIG. 5, and FIG. 6B is a timing diagram showing the operation of the clock generator 510.

First, how to generate the first clock ORCLK will be described. When the positive clock RCLK transits from logic 'low' to logic 'high', that is, at a rising edge of the positive clock RCLK, a voltage of node A temporarily becomes logic 'low'. Thus, a transistor P1 is turned on to transit the first clock ORCLK to a logic 'high' level. After that, when the negative clock FCLK transits from logic 'low' to logic 'high', that is, at a rising edge of the negative clock FCLK, a voltage of node B temporarily becomes a logic 'low' level. Thus, a transistor N2 is turned on to transit the first clock ORCLK to a logic 'low' level. That is, the first clock ORCLK is transited to logic 'high' at a rising edge of the positive clock RCLK and is transited to logic 'low' at a rising edge of the negative clock FCLK. Accordingly, the first clock ORCLK has a logic 'high' level during a 'high' pulse interval of a clock expressed by the positive clock RCLK and the negative clock FCLK.

Now, how to generate the second clock OFCLK will be described. When the negative clock FCLK transits from logic 'low' to logic 'high', that is, at a rising edge of the negative clock FCLK, a voltage of node B temporarily becomes a logic 'low' level. Thus, a transistor P2 is turned on to transit the second clock OFCLK to a logic 'high' level. After that, when the positive clock RCLK transits from logic 'low' to logic 'high', that is, at a rising edge of the positive clock RCLK, a voltage of node A temporarily becomes a logic 'low' level. Thus, a transistor N4 is turned on to transit the second clock OFCLK to a logic 'low' level. That is, the second clock OFCLK is transited to logic 'high' at a rising edge of the negative clock FCLK and transited to logic 'low' at a rising edge of the positive clock RCLK. Accordingly, the second clock OFCLK has a logic 'high' level during a 'low' pulse interval of a clock expressed by the positive clock RCLK and the negative clock FCLK.

An operation timing of the clock generator during the operation (that is, the duty correction operation is initiated but not yet completed) of the DCC is illustrated in FIG. 6B. Referring to FIGS. 6A and 6B, it may be seen that the first clock ORCLK and the second clock OFCLK are generated.

Figure 7:
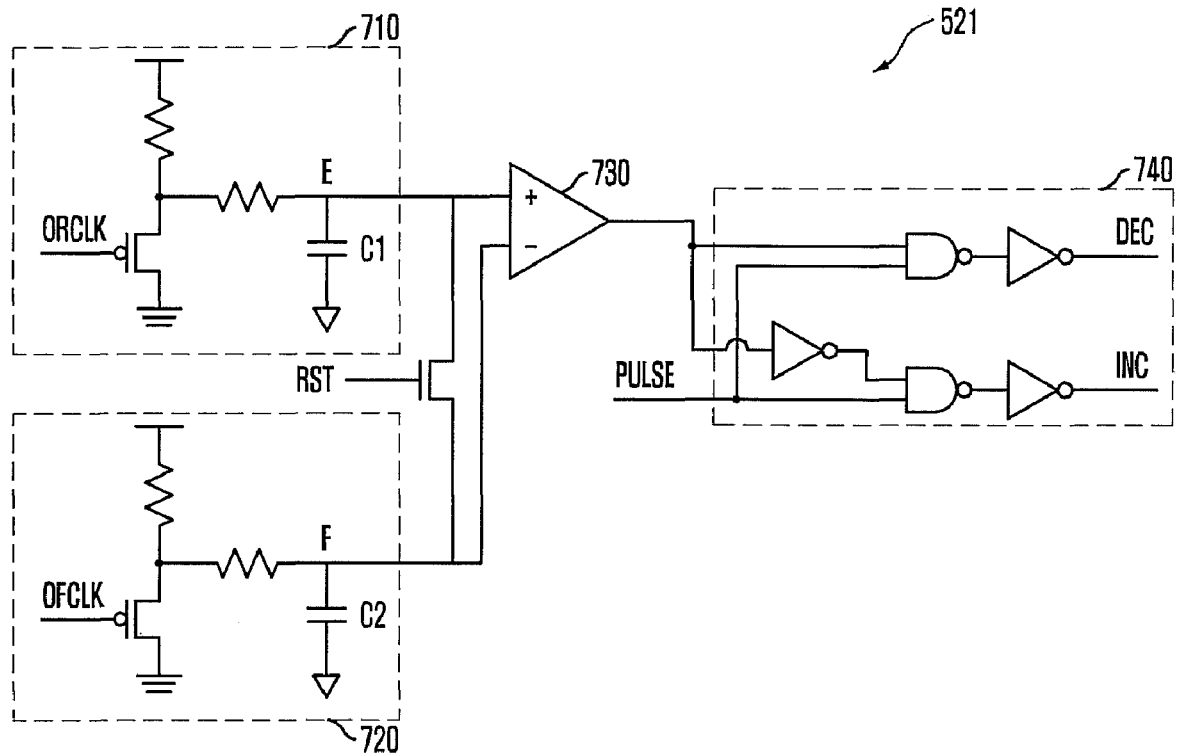
FIG. 7 is a detailed circuit diagram of the comparator shown in FIG. 5.

FIG. 7 is a detailed circuit diagram of the comparing unit shown in FIG. 5.

The comparing unit 521 includes a charge/discharge circuit 710 and 720, a comparator 730, and a trigger 740.

The charge/discharge circuit 710 and 720 is charged/discharged in response to the first clock ORCLK to adjust a voltage of node E. While the first clock ORCLK is activated to logic 'high', a capacitor C1 is discharged and thus a voltage of node E drops. On the other hand, while the first clock ORCLK is deactivated to logic 'low', the capacitor C1 is charged and thus the voltage of node E rises.

The charge/discharge circuit 720 is charged/discharged in response to the second clock OFCLK to adjust a voltage of F node. While the second clock OFCLK is activated to logic 'high', a capacitor C2 is discharged and thus a voltage of node F drops. On the other hand, while the second clock OFCLK is deactivated to logic 'low', a capacitor C2 is charged and thus the voltage of node F rises.

The comparator 730 compares the voltage of node E with the voltage of F node. If an activation interval of the first clock ORCLK is larger than an activation interval of the second clock OFCLK, that is, if a 'high' pulse interval of the clock is larger than a 'low' pulse interval thereof, the voltage of node E will be lower than the voltage of node F and thus the comparator 730 generates a logic 'low' signal. On the other hand, if an activation interval of the second clock OFCLK is larger than an activation interval of the first clock ORCLK, that is, if a 'low' pulse interval of the clock is larger than a 'high' pulse interval thereof, the voltage of node F will be lower than the voltage of node E and thus the comparator 730 generates a logic 'high' signal.

That is to say, the comparator 730 outputs information on whether the 'high' pulse width of a clock expressed by the positive clock RCLK and the negative clock FCLK is larger than the 'low' pulse width thereof.

The trigger 740 outputs an increase signal INC or a decrease signal DEC depending on the output from the comparator 730. If the output from the comparator 730 has a logic 'low' value, the trigger 740 activates the increase signal INC as an output signal and, if the output from the comparator 730 has a logic 'high' value, the trigger 740 activates the decrease signal DEC as an output signal. A pulse signal PULSE is used for the trigger 740 to periodically output the increase signal INC and the decrease signal DEC. That is, the trigger 740 outputs the increase signal INC or the decrease signal DEC whenever the pulse signal PULSE is activated.

To be specific, a signal which is periodically activated is used as the pulse signal PULSE. A rapid period of the pulse signal PULSE makes the increase signal INC and the decrease signal DEC frequently output to achieve more rapid duty correction, but may lower the accuracy of duty correction because the increase signal INC and the decrease signal DEC may be output in a state where there is lack of charge/discharge of nodes E and F. On the other hand, a slow period of the pulse signal PULSE makes operational characteristics of the comparing unit 521 improved, but may lower the speed of duty correction because the increase signal INC and the decrease signal DEC are output in a state where the charge/discharge of E and F nodes is sufficiently made.

Therefore, the period of the pulse signal PULSE needs to be adjusted in consideration of the stability of operation and the speed of duty correction. In the operation timing diagram of the present invention, there is the presence of the pulse signal PULSE that is enabled once per five clocks by way of example.

Additionally provided is a transistor which receives a rest signal RST and makes the voltages of E and F nodes maintained identically to each other prior to activation of the comparing unit 521.

Figure 8:
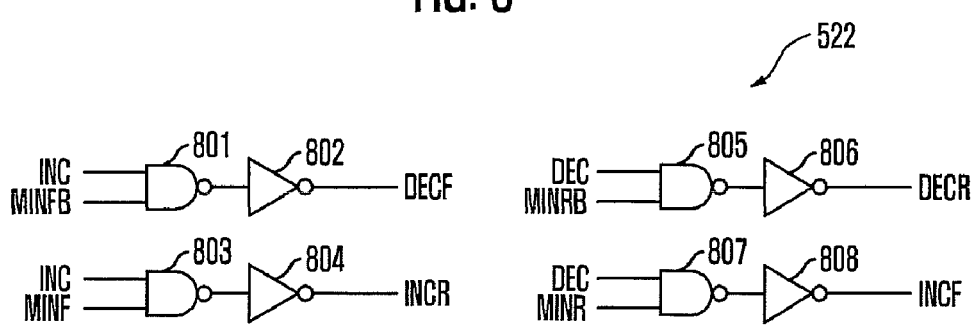
FIG. 8 is a detailed circuit diagram of the signal generator shown in FIG. 5.

FIG. 8 is a detailed circuit diagram of the signal generator 522 shown in FIG. 5.

The signal generator 522 includes NAND gates 801, 803, 805 and 807, and inverters 802, 804, 806 and 808.

Among these gates, the NAND gate 801 and the inverter 802 combine an increase signal INC with an inverted signal MINFB of a negative minimum signal and output a negative decrease control signal DECF. Basically, if the increase signal INC has a logic 'high' value, the negative decrease control signal DECF is activated to logic 'high'. However, if the inverted signal MINFB of the negative minimum signal has a logic 'low' value, the negative decrease control signal DECF is inactivated to logic 'high'. The inverted signal MINFB of the negative minimum signal has a logic 'low' value. This indicates that the negative minimum signal MINF has a logic 'high' value. This in turn implies that the delay value of the negative delay unit 312 is set minimally at present, because it is impossible to further decrease the delay value of the negative delay unit 312.

The NAND gate 803 and the inverter 804 combine the increase signal INC with the negative minimum signal MINF and output a positive increase control signal INCR. In order to make the positive increase signal control INCR activated to logic 'high', the negative minimum signal MINF should have a logic 'high' value and the increase signal INC should have a logic 'high' value. That is, the positive increase control signal INCR has a logic 'high' value only when there is under circumstance where the negative decrease control signal DECF have a logic 'low' value (that is, where the delay value of the negative delay unit may be no longer be reduced), with the increase signal INC having a logic 'high' value.

The NAND gate 805 and the inverter 806 combine the decrease signal DEC with an inverted signal MINRB of a positive minimum signal and output a positive decrease control signal DECR. Basically, if the decrease signal DEC has a logic 'high' value, the positive decrease control signal DECR is activated to logic 'high'. However, if the inverted signal MINRB of the positive minimum signal has a logic 'low' value, the positive decrease control signal DECR is not activated to logic 'high'. The inverted signal MINRB of the positive minimum signal has a logic 'low' value. This indicates that the positive minimum signal MINR has a logic 'high' value. This in turn implies that the delay value of the positive delay unit 311 is set minimally at present, because it is impossible to further decrease the delay value of the positive delay unit 311.

The NAND gate 807 and the inverter 808 combine the decrease signal DEC with the positive minimum signal MINR and output a negative increase control signal INCF. In order to make the negative increase control signal INCF activated to logic 'high', the positive minimum signal MINR should have a logic 'high' value and the decrease signal DEC should have a logic 'high' value. That is, the negative increase control signal INCF has a logic 'high' value only when there is under circumstance where the positive decrease control signal DECR have a logic 'low' value (that is, where the delay value of the positive delay unit may be no longer be reduced), with the decrease signal DEC having a logic 'high' value.

That is to say, the signal generator 522 activates the negative decrease control signal DECF or the positive increase control signal INCR when the increase signal INC is activated, but it activates the negative decrease control signal DECF and activates the positive increase control signal INCR only when it fails to activate the negative decrease control signal DECF. Also, the signal generator 522 activates the positive decrease control signal DECR or the negative increase control signal INCF when the decrease signal DEC is activated, but it activates the positive decrease control signal DECR and activates the negative increase control signal INCF only when it fails to activate the positive decrease control signal DECR.

Based on this operation, the signal generator 522 keeps a minimum delay amount used for the positive delay unit 311 and the negative delay unit 312 to correct the duty cycle, thereby enhancing characteristics of clock.

Figure 9:
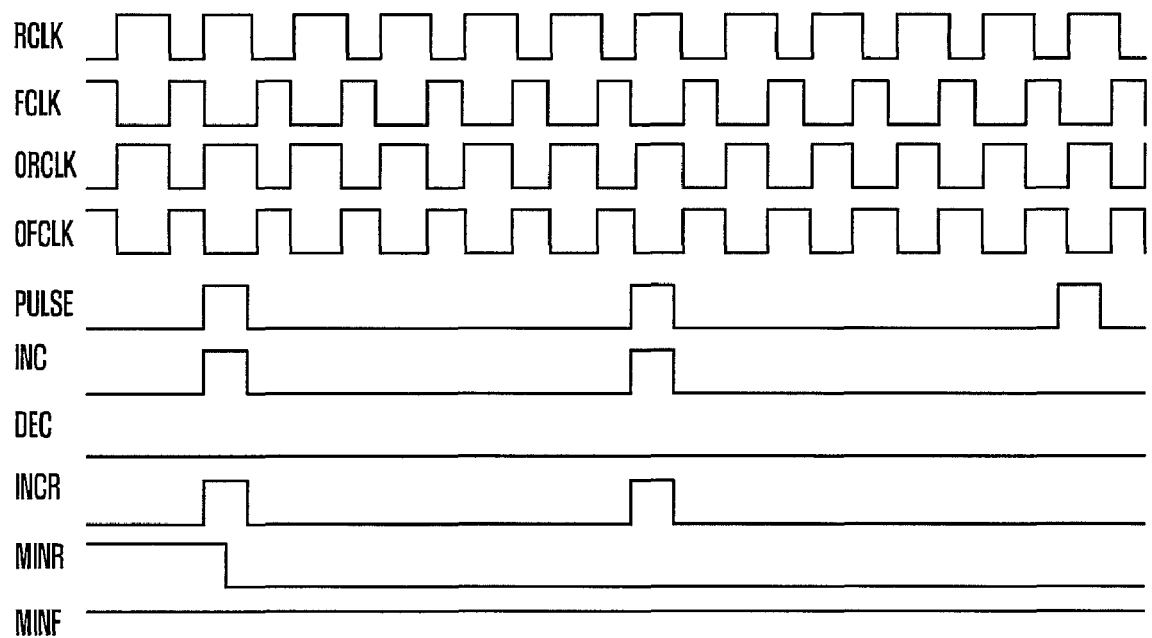
FIG. 9 is a timing diagram showing an overall operation of the DCC in accordance with an embodiment of the present invention.

FIG. 9 is a timing diagram showing an overall operation of the DCC in accordance with the present invention.

As shown, there is illustrated a procedure of performing duty correction of clock in case where a 'high' pulse width of a clock expressed by the positive clock RCLK and the negative clock FCLK is large. First, when a pulse signal PULSE is activated, the increase signal INC is activated and output in the comparing unit 521. The increase signal INC activates the positive increase control signal INCR, which in turn increases a delay value of the positive delay unit 311 to makes a 'high' pulse width of clock decreased. This operation is repeatedly performed to gradually correct the duty cycle of clock.

Referring again to the drawing, it can be found that the interval from a rising edge of the positive clock RCLK and a rising edge of the negative clock FLCK and the interval from a rising edge of the negative clock FCLK and a rising edge of the positive clock RCLK become identical to each other more and more with the passage of time. Additionally, it can also be seen that the 'high' pulse interval and 'low' pulse interval of the first clock ORCLK and the second clock OFCLK become identical to each other more and more.

Figure 10:
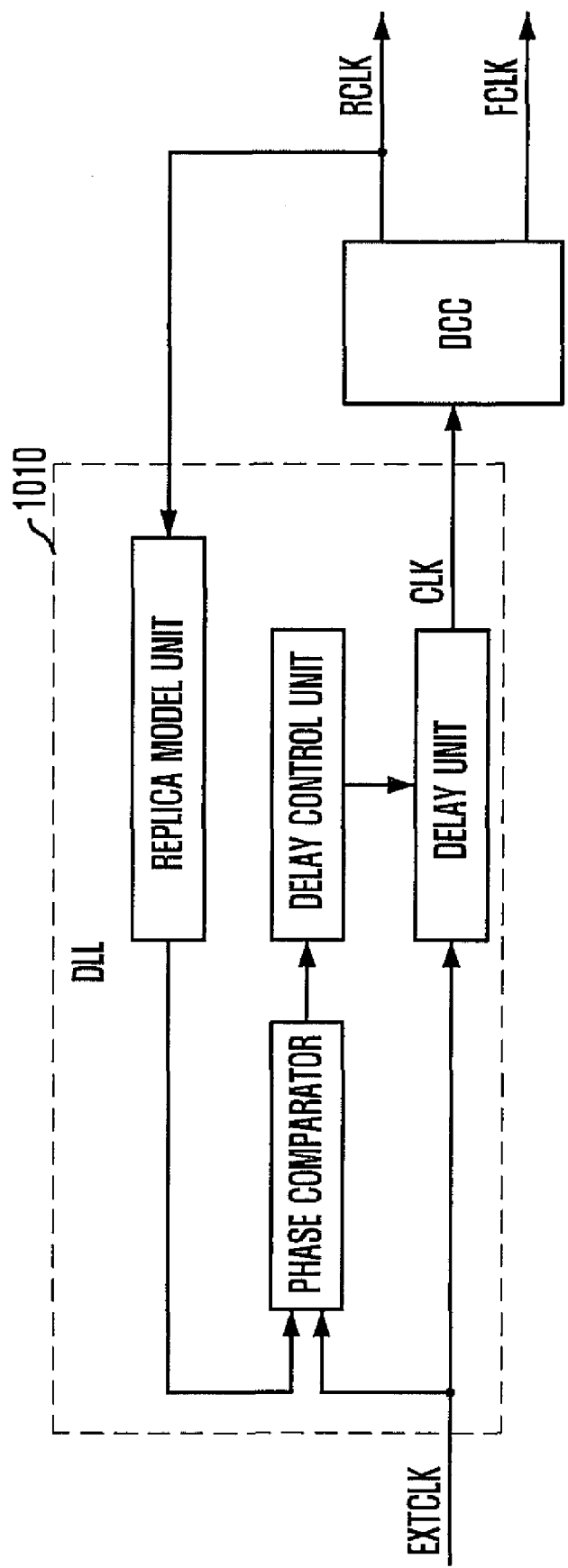
FIG. 10 is a block diagram of a clock generator including a DLL of a single loop and the DCC shown in FIG. 3.

FIG. 10 is a detailed block diagram of a clock generator including a DLL of a single loop and the DCC shown in FIG. 3.

As shown, the clock generator includes a DLL 1010 of single loop for generating an internal clock CLK in response to an external clock EXTCLK, and a DCC (see FIG. 3) for correcting a duty cycle of the internal clock CLK. Since the DLL has been already described in detail, a further description thereon will be omitted here.

Figure 1:
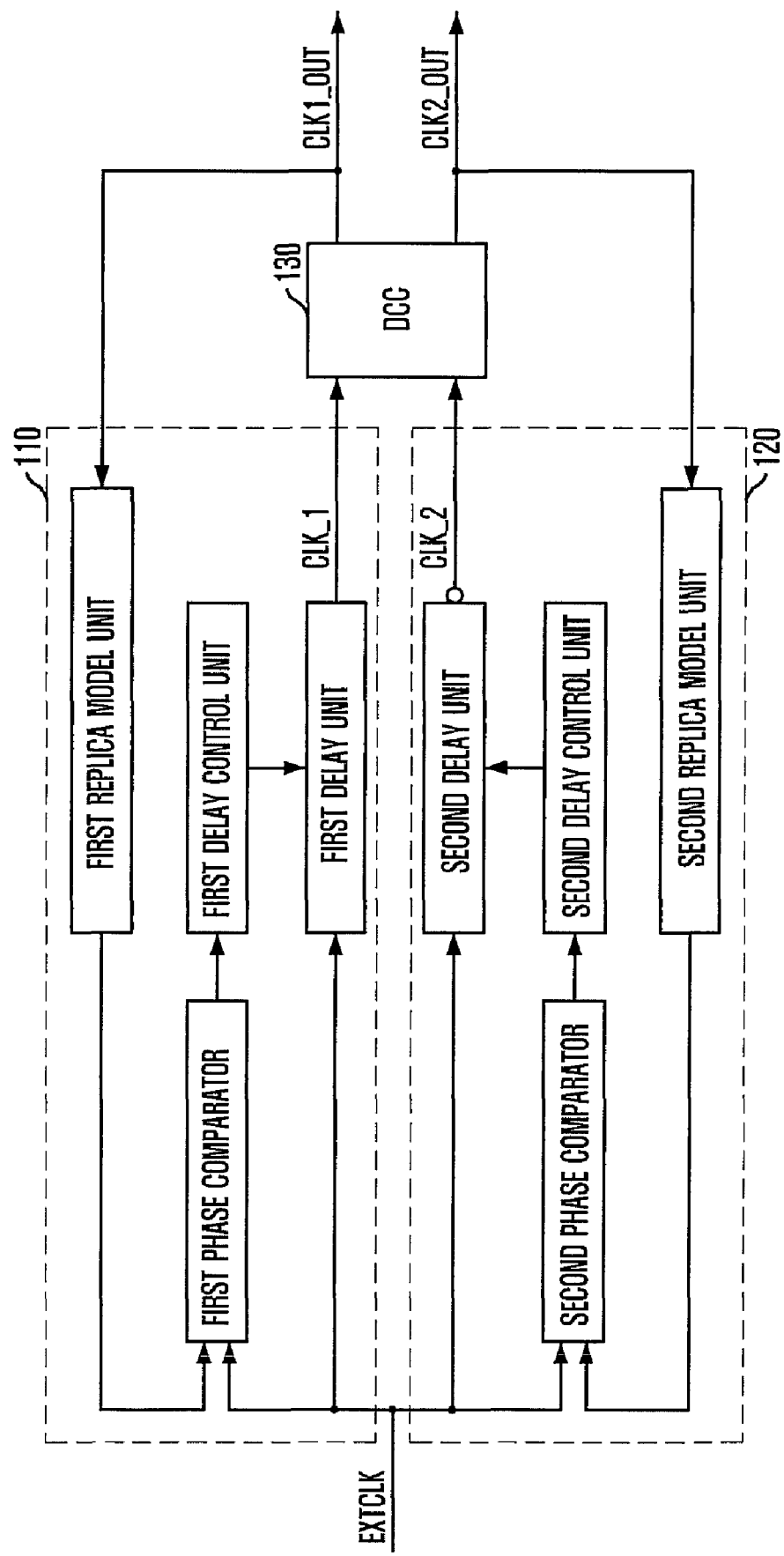
FIG. 1 is a block diagram illustrating a conventional Duty Cycle Corrector (DCC) for correcting a duty cycle of clock by mixing clocks.
Figure 2:
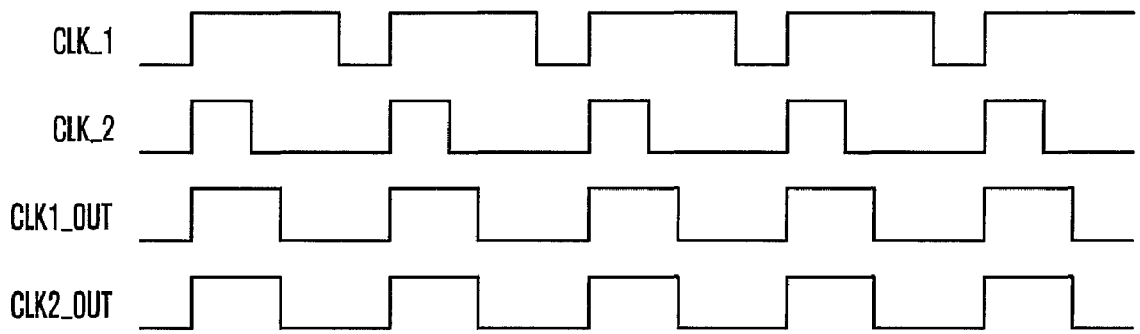
FIG. 2 a timing diagram showing a schematic operation of the conventional DCC 130.

Using the DCC of the present invention eliminates the need of configuring the DLL as dual loop, as in the prior art circuit (see FIG. 1). This is because the DCC (see FIG. 3) of the present invention corrects the duty cycle based on only one clock CLK.

The DLL 1010 of single loop structure includes a phase comparator, a delay adjustor, a delay unit, and a replica model unit as basic components thereof, each of them including only one.

In this manner, the present invention enables duty correction based on only one clock CLK, thereby rendering the DLL 1010 configured in single loop even in any system needing duty correction of clock.

As described above, the DCC in accordance with the present invention adjusts relative delay values between an input clock and an inverted clock of the input clock to correct the duty cycle of clock. In addition, the DCC of the present invention controls a delay line for its minimal use in the duty correction, thereby making clock characteristics excellent.

While the present invention has been described with respect to the specific embodiments, it will be apparent to those skilled in the art that various changes and modifications may be made without departing from the spirit and scope of the invention as defined in the following claims.

What is claimed is:

1. A duty cycle corrector, comprising:
   a delay unit configured to adjust an input clock and an inverted input clock with a delay value controlled in response to one or more control signals and to generate a positive clock and a negative clock; and a duty detector configured to receive the positive clock and the negative clock, to detect duty ratios of the positive clock and the negative clock and to generate the one or more control signals according to a comparison result of an activation interval of a first clock with that of a second clock, wherein the first clock is activated from a predetermined edge of the positive clock to a predetermined edge of the negative clock and a second clock is activated from a predetermined edge of the negative clock to a predetermined edge of the positive clock.

2. The duty cycle corrector as recited in claim 1, wherein the delay unit includes:
a positive delay unit configured to adjust a delay value of the input clock and to output the positive clock; and
a negative delay unit configured to adjust a delay value of the inverted clock of the input clock and to output the negative clock.

3. The duty cycle corrector as recited in claim 2, wherein the duty detector is configured to generate the one or more control signals so that the delay value in the negative delay unit is decreased prior to an increase of a delay value in the positive delay unit, and the delay value of the positive delay unit is decreased prior to an increase of a delay value in the negative delay unit.

4. The duty cycle corrector as recited in claim 2, wherein the duty detector is configured to generate a positive increase control signal and a positive decrease control signal to adjust the delay value of the positive delay unit, and generate a negative increase control signal and a negative decrease control signal to adjust the delay value of the negative delay unit, and
wherein the positive decrease control signal is activated prior to the negative increase control signal, and the negative decrease control signal is activated prior to the positive increase control signal.

5. A duty cycle corrector, comprising:
a positive delay unit configured to adjust an input clock with a delay value controlled in response to a positive increase control signal and a positive decrease control signal and to output a positive clock;
a negative delay unit configured to adjust the inverted input clock with a delay value controlled in response to a negative increase control signal and a negative decrease control signal and to output a negative clock;
a clock generator configured to generate a first clock that is activated from a predetermined edge of the positive clock to a predetermined edge of the negative clock, and to generate a second clock that is activated from a predetermined edge of the negative clock to a predetermined edge of the positive clock; and
a detector configured to compare an activation interval of the first clock with that of the second clock and to output the positive increase control signal, the positive decrease control signal, the negative increase control signal and the negative decrease control signal.

6. The duty cycle corrector as recited in claim 5, wherein the detector is designed in a manner that the positive decrease control signal is activated prior to the negative increase control signal and the negative decrease control signal is activated prior to the positive increase control signal.

7. The duty cycle corrector as recited in claim 5, wherein the detector includes:
a comparing unit configured to compare an activation interval of the first clock with that of the second clock; and
a signal generator configured to activate the negative decrease control signal or the positive increase control signal if an activation interval of the first clock is larger than that of the second clock based on the comparison result, and to activate the positive decrease control signal or the negative increase control signal if an activation interval of the second clock is larger than that of the first clock based on a comparison result.

8. The duty cycle corrector as recited in claim 7, wherein, if a delay value of the negative delay unit is no longer decreased, the signal generator is configured to activate the positive increase control signal, but otherwise activate the negative decrease control signal, and
if a delay value of the positive delay unit is no longer decreased, the signal generator is configured to activate the negative increase control signal, but otherwise, the signal generator is configured to activate the positive decrease control signal.

9. The duty cycle corrector as recited in claim 8, wherein the signal generator is configured to determine whether the delay values of the positive delay unit and the negative delay units is further decreased, based on a positive minimum signal indicating that a current delay value of the positive delay unit is a minimum value and a negative minimum signal indicating that a current delay value of the negative delay unit is a minimum value.

10. The duty cycle corrector as recited in claim 5, wherein the first clock is output as a final clock with corrected duty.

11. The duty cycle corrector as recited in claim 5, wherein the second clock is output as a final clock with corrected duty.

12. A clock generator, comprising:
a delay locked loop configured to generate an internal clock in response to an external clock; and
a duty cycle corrector configured to correct a duty cycle of the internal clock,
wherein the duty cycle corrector includes:
a delay unit configured to adjust the internal clock and an inverted internal clock with a delay value controlled in response to one or more control signals and to generate a positive clock and a negative clock; and
a duty detector configured to receive the positive clock and the negative clock, to detect duty ratios of the positive clock and the negative clock and to generate the one or more control signals according to a comparison result of an activation interval of a first clock with that of a second clock,
wherein the first clock is activated from a predetermined edge of the positive clock to a predetermined edge of the negative clock and a second clock is activated from a predetermined edge of the negative clock to a predetermined edge of the positive clock.

13. The clock generator as recited in claim 12, wherein the delay unit includes:
a positive delay unit configured to adjust a delay value of the internal clock and to output the positive clock; and
a negative delay unit configured to adjust a delay value of the inverted clock of the internal clock and to output the negative clock.

14. The clock generator as recited in claim 13, wherein the duty detector is configured to generate the one or more control signals so that the delay value of the negative delay unit is decreased prior to an increase of a delay value in the positive delay unit, and the delay value of the positive delay unit is decreased prior to an increase of a delay value in the negative delay unit.

15. The clock generator as recited in claim 13, wherein the duty detector is configured to generate a positive increase control signal and a positive decrease control signal to adjust the delay value of the positive delay unit, and generate a negative increase control signal or a negative decrease control signal to adjust the delay value of the negative delay unit, and wherein the positive decrease control signal is activated prior to the negative increase control signal, and the negative decrease control signal is activated prior to the positive increase control signal.

* * * * *